United States Patent [19]

Tucci et al.

[11] Patent Number: 4,847,598

[45] Date of Patent: Jul. 11, 1989

[54] WATER TREATMENT REGENERATION SYSTEM INCORPORATING ALTERNATING CURRENT EXCITATION AND PAIRED OPERATIONAL AMPLIFIERS WITH ASYMMETRICAL FEEDBACK ELEMENTS

[75] Inventors: Mario A. Tucci, Maplewood; George K. Sutherland, White Bear Lake, both of Minn.

[73] Assignee: Aqua-Tronics, Inc., St. Paul, Minn.

[21] Appl. No.: 126,472

[22] Filed: Nov. 27, 1987

[51] Int. Cl.[4] .............................................. G08B 21/00
[52] U.S. Cl. .................................... 340/603; 324/444; 324/449; 210/106; 210/96.1; 210/86; 210/670
[58] Field of Search ................. 340/603; 210/144, 106, 210/85, 86, 96.1, 96.2, 662, 675, 670; 324/442–444, 446–450, 439; 137/5

[56] References Cited

U.S. PATENT DOCUMENTS

| | | | |
|---|---|---|---|
| 2,468,791 | 5/1949 | Thomson | 210/96.1 |
| 2,617,766 | 11/1952 | Emmett et al. | 210/96.1 |
| 2,760,152 | 8/1956 | Katz et al. | 340/603 |
| 3,172,037 | 3/1965 | Pfeiffer | 324/439 |
| 3,282,426 | 4/1966 | Entringer | 210/96.1 |
| 3,618,769 | 11/1971 | Iglesias | 210/96.2 |
| 3,701,006 | 10/1972 | Volkel et al. | 324/442 |
| 3,768,649 | 10/1973 | Fleckenstein | 210/96.1 |
| 4,072,892 | 2/1978 | Lind | 324/448 |
| 4,177,144 | 12/1979 | Hickey et al. | 210/86 |
| 4,262,253 | 4/1981 | Clark | 324/442 |
| 4,264,439 | 4/1981 | Lefevre et al. | 209/454 |
| 4,320,010 | 3/1982 | Tucci et al. | 210/96.1 |
| 4,331,923 | 5/1982 | Akers, Jr. | 324/449 |
| 4,379,057 | 5/1983 | Meiser et al. | 210/96.1 |
| 4,426,294 | 1/1984 | Seal | 210/662 |
| 4,442,229 | 4/1984 | Emmett | 210/662 |
| 4,587,518 | 5/1986 | King | 340/603 |
| 4,594,553 | 6/1986 | Varga | 324/450 |
| 4,622,133 | 11/1986 | Furuno | 210/96.1 |
| 4,668,386 | 5/1987 | Seal et al. | 210/96.1 |
| 4,691,168 | 9/1987 | Dzula | 324/439 |

FOREIGN PATENT DOCUMENTS

| | | | |
|---|---|---|---|
| 2310972 | 10/1976 | France | 210/96.1 |
| 0726559 | 5/1980 | U.S.S.R. | 340/603 |

*Primary Examiner*—Joseph A. Orsino
*Assistant Examiner*—Jill D. Jackson
*Attorney, Agent, or Firm*—Orrin M. Haugen; Thomas J. Nikolai; Frederick W. Niebuhr

[57] ABSTRACT

A signal responsive circuit especially adapted for use in a water treatment system for signaling the need for regeneration of an ion exchange resin bed or the replacement of a particulate filter medium. A series of three electrodes are disposed in the water treatment medium in longitudinally spaced relation along the direction of flow and an alternating current signal drives the center-most electrode. The two outer electrodes are coupled as inputs to first and second operational amplifiers having asymmetrical gain characteristics. When the effective resistance between the center electrode and the two outer electrodes are equal, which is the condition prior to the movement of the hardness front or contamination front to the location of the electrodes, a first signal output condition exists. However, when the resin bed or filter medium becomes "exhausted" to the point where the hardness or contamination front moves to a point between the center and upstream electrode, the signal output condition reverses state and can be used to trigger regeneration or replacement of the medium. The use of an alternating current drive signal obviates problems relating to electrode contamination or erosion. Further, an AGC circuit is utilized to ensure proper operation under variations in ambient conditions, such as temperature changes in the medium. A low pass filter also is effective to render the system less subject to short-duration transient conditions.

7 Claims, 2 Drawing Sheets

WATER TREATMENT REGENERATION SYSTEM INCORPORATING ALTERNATING CURRENT EXCITATION AND PAIRED OPERATIONAL AMPLIFIERS WITH ASYMMETRICAL FEEDBACK ELEMENTS

BACKGROUND OF THE INVENTION

The present invention relates generally to an improved condition-responsive means for electrically sensing the degree of exhaustion of a cation exchange column or other type of apparatus adapted to treat hard or mineral-containing water, ionized water or for filtering particulates from turbid water. Such water conditioning systems are, of course, relatively widely employed for water treatment, both on an industrial as well as a residential basis.

In the past, a wide variety of systems and techniques have been employed to detect the condition of a resin bed, such as those employed in ion exchange columns or to detect that a filter media needs replacement. These prior art systems typically employ a Wheatstone bridge circuit which, when becoming unbalanced, will trigger a mechanism to actuate the regeneration of the portion of the system which becomes exhausted during use. In the case of a water softener, saturated brine solutions are employed to achieve this regeneration. For example, in residential softeners, a brine tank is employed which has saturated sodium chloride as the active ingredient. The sodium is exchanged for the cations normally contributing to the hardness of the water supply during the softening process. Such cations are typically calcium and magnesium, along with others, such as iron or the like.

To detect the condition of the resin bed disposed in the ion exchange column, electrical sensors, such as spaced-apart probes have been employed in the past. Among the problems typically encountered in the use of such probes are the surface coating thereof by waterborne contaminants, or, alternatively, the electrolytic decomposition of the probe due to the imposition of electrical energy into the system through the probe. Whenever DC current is employed, electrolytic decomposition of the probes become a major concern.

To avoid such decomposition, carbon probes have been proposed in the past. Carbon probes, unfortunately, have been found to become coated or plated with certain of the metal ion constituents of the water supply, and thus change or drift with time so as to become relatively ineffective.

In many of the prior art devices, the objectives or goals of the system are accomplished by a change in conductivity of the ion exchange column, particularly between a spent portion of the column as compared to an unspent or unexhausted portion of the column. Resistivity measurements have been employed as a means of determining the condition of the column, and problems have arisen in finding an effective means for detecting and/or determining resistivity measurements in such an environment over extended periods of time. The present invention, however, achieves the goal of long-term detection, without suffering from problems of electrode probe contamination or electrolysis deterioration.

Certain prior art water treatment regeneration systems are temperature sensitive. That is to say, a triggering event may not be due solely to the movement of the hardness front through the column, but also by the passage of a temperature front. Where, for example, a water softener bed is located in an out-of-doors tank in a hot climate, when water is drawn through the tank, the cold water front propagates through the bed and can cause an unbalancing of the detector electronics to initiate a regeneration cycle when none is required.

SUMMARY OF THE INVENTION

Briefly, and in accordance with the present invention, a condition-responsive means is provided for electrically sensing the degree of exhaustion of a medium used in the treatment of mineral-containing or ion-containing water. It may also be used to signal the need to replace a filter medium which has absorbed its limit of contaminants. The condition responsive system of the present invention employs a plurality of spaced-apart probes across which an AC signal is impressed. The electrical resistance between the electrodes is monitored in the column. A change in resistance between adjacent probes is, accordingly, indicative of the hardness or other condition of the bed used in the treatment equipment. In its simplest form, the system comprises an axially elongated column with a set of three probes disposed proximate the water outlet end of the bed. The probes may typically be spaced about $\frac{1}{4}''$ apart in the direction of flow. The intermediate probe is pulsed with an AC signal, and the condition of the treatment bed determines the magnitude of the signal sensed by the other two electrodes located on opposed sides of the intermediate probe. Difference amplifier means are provided whose gain responds to the change in condition between the probes. The difference amplifier means is, in turn, coupled by suitable phase discriminating circuitry to a means for actuating the regeneration system associated with the column.

As is known in the art, the presence of a discontinuity, such as a hardness front in the water softening ion exchange bed, creates a DC potential difference which is sensed by the probes. In the present invention, this DC potential is intentionally decoupled from the difference amplifier means by capacitors.

It has been found that the utilization of an alternating current (AC) signal rather than the DC potential, and the elimination of the typically employed bridge, contributes to the long-term stability and reliability of the system, and further contributes to a preservation of the integrity and/or lack of electrolytic decomposition or selective plating of the individual electrode probes.

The circuit of the present invention also includes a long time constant RC filter network which effectively prevents false triggering of the regeneration system by short-term transient resistance changes between the sensing probes, such as may be occasioned by the passage of a temperature front or other electrical artifacts which have a duration less than a preset time interval.

OBJECTS

Therefore, it is a primary object of the present invention to provide an improved system for determining and/or sensing the condition of a water treatment column, wherein the system employs a plurality of closely spaced electrodes disposed near the water outlet and utilized to sense the electrical resistance in the column between pairs of electrodes.

It is a further object of the present invention to provide an improved system for determining the degree of contamination of a filter media or the exhaustion of the resin bed of an ion exchange column of a commercial or residential water softener, wherein the filter or resin bed is provided with at least three sensing probes longitudinally disposed near the outlet end thereof in the direction of flow, the common electrode probe being interposed between the other two and energized by an AC signal for detection of the electrical resistance condition of that portion to the resin bed lying between the respective sensing probes and the common probe.

Another object of the invention is to provide a detector circuit for a rechargeable water treatment system which is less subject to false triggering than known prior art systems.

Other and further objects of the present invention will become apparent to those skilled in the art upon a study of the following specification, appended claims, and accompanying drawings in which like numerals in the several views refer to corresponding parts.

IN THE DRAWING

FIG. 1 is a schematic of the signal responsive circuit employed in connection with the system of the present invention and which illustrates the manner in which the sensing electrode probes are disposed within the ion exchange column; and FIG. 2 is a schematic of the power supply utilized in the circuit of FIG. 1.

DESCRIPTION OF THE PREFERRED EMBODIMENT

Figure 1:
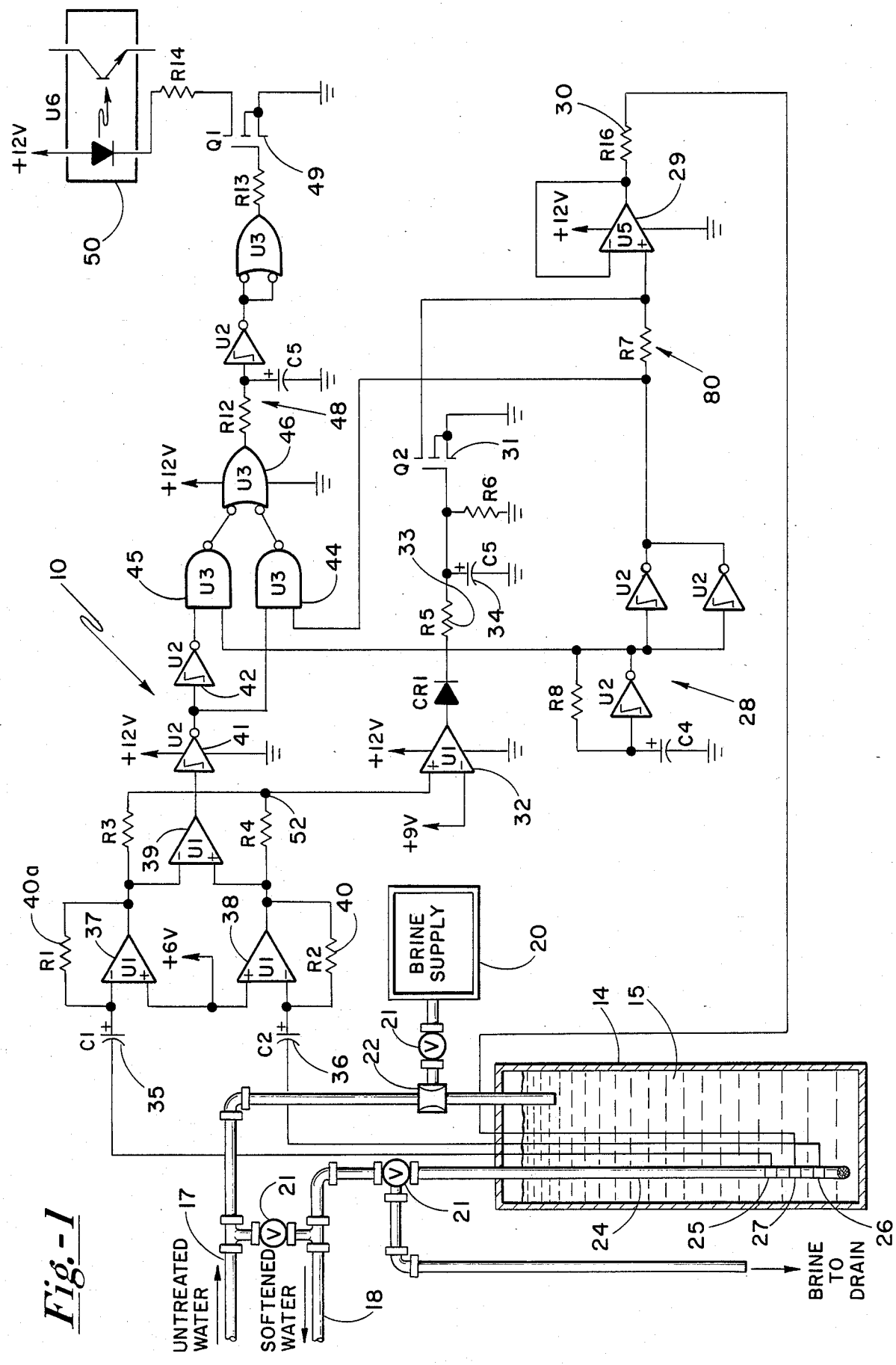
Figure 2:
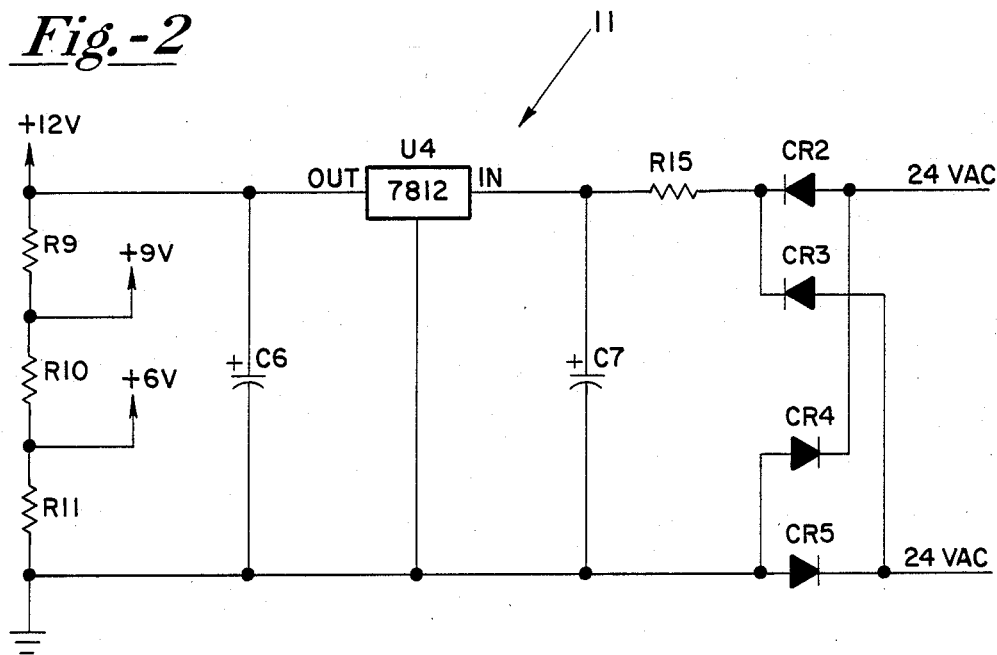

In accordance with the preferred embodiment of the present invention, and with particular attention being directed to the schematic illustrations of FIGS. 1 and 2, the system generally designated 10 employs an AC to DC regulated power supply 11 (FIG. 2) which is conventional in its design and which is functionally coupled to the circuit at the indicated +12, +9 and +6 DC power input junctions in FIG. 1.

In FIG. 1 of the drawings, it will be noted that the system 10 is shown as being coupled, in part, to a water treatment bed which may, for example, be an ion exchange column 14 in which there is disposed and contained a resin bed as at 15. Ion exchange column 14 does, of course, include an axially elongated cylinder or other chamber, which is, in turn, provided with an untreated water inlet as at 17 and a treated water outlet as at 18. Also, as is conventional in ion exchange columns, the resin bed is provided with a recharging system, such as brine supply 20 which has its outlet coupled through a regeneration control valve 21 and a venturi 22 to ion exchange column 14. Spent brine is made to exit the ion exchange column via regeneration valve 21' during regeneration while untreated (hard water) by-passes the water treatment apparatus via regeneration valve 21''. In a practical system, valve members 21, 21' and 21'' are contained within a common valve housing but, for ease of description, they are shown as discrete elements.

With further attention being directed to ion exchange column 14, a plurality of electrode ring probes are shown being positioned on a plastic down-pipe 24 inserted within the column, with a first electrode probe 25 (the upstream probe) being disposed adjacent to the common probe 27 at a location near the outlet end, and a second electrode probe 26 (the downstream probe) positioned in the column also adjacent the common probe 27. Wire conductors for coupling the electrodes to driving and sensing circuitry may be routed along the side of the down-pipe 24 as shown. The resin bed acts as an electrical, condition-responsive resistance element between common electrode 27 and the upstream probe 25 and the downstream probe 26. The resistance between probe 27 and probe 25 is referred to as $R_U$ while that between probe 27 and probe 26 is referred to as $R_L$. $R_U$ and $R_L$ have resistance that is a function of the ambient water temperature and whether the ion exchange resin is exhausted or, in the case of a carbon or diatomaceous earth filter, whether the media has become contaminated. In that the spacing between electrode 27 and the other two electrodes is equal, for any given temperature of the resin, $R_U$ will equal $R_L$ when the ion exchange resin is sodium saturated or the filter material is not contaminated.

As water is softened or de-ionized in the case of an ion exchange process, or as a filter media becomes contaminated, a front or plane is formed perpendicular to the direction of water flow where upstream of the front, the resin is saturated with hard water ions (Ca, Fe, Mg) which means it is "exhausted" or the filter is ladened with particulate. As ion replacement takes place, the resistance of the bed increases. With filters, contamination may result in either a resistance increase or decrease.

As is indicated hereinabove, means are provided for delivering an alternating current drive signal to the electrodes, specifically to intermediate electrode probe 27. The alternating current signal is generated by a low frequency relaxation oscillator 28 whose output is coupled to electrode probe 27. The oscillator may be designed to produce a square wave signal of a frequency in the range of from 20 Hz to 80 Hz. The oscillator output is also coupled as an input to a unity gain amplifier 29 whose output drives common electrode 27 through coupling resistor 30. Coupled to the non-inverting input of unity gain amplifier 29 is the drain electrode of an FET device 31 whose gate electrode is driven by the output of a comparator 32, via an RC time delay circuit including resistor 33 and capacitor 34.

Electrode probes 25 and 26 are capacitively coupled by decoupling capacitors 35 and 36 to first and second operational amplifiers (op/amps) 37 and 38, respectively. In this fashion, therefore, the signals sensed at electrode probes 25 and 26 are decoupled from any DC signals generated within the resin bed. Furthermore, coupled across the outputs of amplifiers 37 and 38 is a differential amplifier 39 which senses the magnitude of the difference in output signals from amplifiers 37 and 38.

Asymmetrical impedance means, such as resistors 40a and 40, are coupled as feedback elements from the output to the inverting inputs of amplifiers 37 and 38, respectively. Initially, $R_U$ and $R_L$ have equal ohmic values. The gain of op/amp 37 is the ohmic value of feedback resistor 40a divided by the ohmic value of $R_U$. Initially, the peak-to-peak value of the output voltage of op/amp 37 will be greater than the peak-to-peak value of the output voltage of op/amp 38 by an amount proportional to the percentage difference between the asymmetrical feedback resistors 40 and 40(a). As the ion exchange resin becomes hard, $R_U$ increases in value while the peak-to-peak voltage at the output of op/amp 37 decreases. A point is reached where the output of op/amp 37 becomes less than that at the output of op/amp 38. This is the indication that the ion exchange column requires regeneration. In the case of a filter, when heavy metals or other contaminants reach the space between the upstream and middle electrodes, $R_U$ decreases rather than increases. Therefore, by utilizing a simple double-pole, double-throw reversing switch (not shown), the role of $R_U$ and $R_L$ can be reversed to accommodate this difference in adapting the condition-responsive circuit of the present invention to a filtering application.

Comparator 39 has its inverting input coupled to the output of op/amp 37 and its non-inverting input coupled to the output of op/amp 38. Thus, comparator 39 provides a digital logic level to inverter 41. Where initially the output of comparator 39 is an AC signal which is in phase with the AC input applied to the middle electrode probe 27, it changes to be 180° out of phase with respect to the AC input at probe 27 when the resin bed becomes exhausted between the upstream probe and the center probe. Inverters 41 and 42 provide the correct phase for the AND-OR circuit implemented with NAND gates 44, 45 and 46. Initially, the two inputs of gate 45 (or gate 44) will be out of phase with respect to one another. Gate 45 will control on one half-cycle of the clock oscillator 28 and gate 44 (or gate 45) will control on the other half-cycle of this clock. When the resin bed 15 becomes exhausted and the ohmic value of $R_U$ increases, comparator 39 will output a signal whereby both inputs to gate 45 will be in phase with one another and, thus, command a binary high signal at the output of gate 46 for one-half clock cycle. Gate 44 will provide a binary high signal at the output gate 46 on the other half of the clock cycle. Thus, a steady-state DC high signal is applied to the low pass filter 48 whose time constant is set so as to act as a one-minute delay in issuing an actual regeneration command.

The RC filter circuit 48 interposes a long-time constant filter so that short duration signal perturbations (those less than one minute long) occurring in the resin bed are ineffective to trigger a regeneration cycle. Stated otherwise, the imbalance must persist for a predetermined period before it will be recognized as a "request" for regeneration.

The signal output from filter 48 is again shaped and applied to the gate of an FET switch 49 whose source and drain electrodes are in series with an opto-coupler type switch 50 which is used to operate the solenoid valves not shown) for effecting the regeneration cycle.

Switching mechanism 50, in the form of an opto-coupler, may be arranged in series with a conventional clock switch so that the recharge operation or cycle for the resin bed 15 may occur at the next succeeding preselected recharge time, such as, for example at 3:00 A.M. when water usage would be expected to be nil. Alternatively, when substantial quantities of water are being utilized and more frequent recharging may be indicated, multiple ion exchange columns may be employed, each being equipped with its separate brine supply and spent brine disposal, and thus undergo alternate recharge operations, thereby always maintaining one softener functional in the system.

The outputs of operational amplifiers 37 and 38 are dot OR'ed together at junction 52 and that junction is tied to the non-inverting input of the comparator 32. In that the inverting input of comparator 32 is tied to a point of fixed potential (+9 V), the drive to the gate electrode of FET 31 will be such as to vary its effective resistance in such a fashion that the peak-to-peak AC output of operational amplifiers 37 and 38 will be less than the fixed potential value (+9V). Thus, the components 32, 34, 33 and 29 function as an AGC circuit. This is important to proper operation when it is considered that the voltages developed between the upper and lower probes and the intermediate probe varies significantly with resin temperature and the AGC circuit thus continues to maintain the peak-to-peak signals for operational amplifiers 37 and 38 relatively independent of such temperature swings when hot and cold water are passed through the resin bed.

The advantages of the present system, due to the utilization of similarly poled sensors, contributes to both longevity of operation and reliability in detecting the proper point to initiate an operational recharge cycle. The system is, of course, built with commercially available components and is capable of being produced on an economic basis.

In addition to the availability of a constant supply of soft water, the system of the present invention conserves and reduces the amount of brine employed in recharging water softeners. This is particularly true when disposal systems, treating effluent, are subjected to substantial quantities of brine, in the form of sodium chloride, which enter the system through the residential and commercial sewage treatment systems. Substantial quantities of sodium chloride, entering sewage treatment facilities in this fashion, are not deemed particularly desirable in the overall ecological system.

What is claimed is:

1. Signal responsive means comprising:
   (a) a source of alternating current voltage;
   (b) first and second series connected water-condition responsive impedance means having a common point coupled to said voltage source;
   (c) first and second operational amplifier means, each having an inverting input, a non-inverting input and an output, each of said operational amplifiers having means for coupling the inverting input of each to said first and second water-condition responsive impedance means, said first and second operational amplifiers further including feedback resistance means of unequal ohmic value coupling the output of each of said operational amplifiers to its respective inverting input such that the output from said first operational amplifier normally is greater than the output form said second operational amplifier, said first and second operational amplifiers each having means for coupling said non-inverting input of each of said first and second operational amplifiers to a point of fixed potential;
   (d) automatic gain control circuit means coupling said outputs of said first and second operational amplifiers to said voltage source for providing compensation for conditions affecting said first and second water-condition responsive impedance means equally; and
   (e) comparator means coupled to the outputs of said first and second operational amplifier means for producing an output signal shift when the output of said second operational amplifier means becomes greater than the output of said first operational amplifier means.

2. The signal responsive means as in claim 1 wherein said means for coupling the inverting input of each of said first and second operational amplifiers to said first and second condition responsive impedance means are direct current decoupling capacitors.

3. The signal responsive means as in claim 1 and further including electrical switch means and low pass filter means coupling said electrical switch means to the output of said comparator means to prevent output signal shifts from said comparator means of a duration less than a predetermined time interval from actuating said switch means.

4. The signal responsive means as in claim 1 wherein said water-condition responsive impedance means comprise first, second and third electrodes disposed in a water treatment medium in longitudinally spaced-apart relation in the direction of water flow through said medium and where the central one of said electrodes comprises said common point.

5. The signal responsive means as in claim 4 wherein said water treatment medium is an ion-exchange resin bed.

6. The signal responsive means as in claim 4 wherein said water treatment medium is a water filtering material.

7. Condition-responsive means for electrically sensing the degree of exhaustion of a water treatment medium, said condition-responsive means comprising:
 (a) an axially elongated column containing a water treatment medium, said column having a water inlet at one end thereof;
 (b) a pair of longitudinally spaced-apart electrodes positioned within said medium proximate the water outlet end of said column and an intermediate electrode disposed between said pair of electrodes;
 (c) power supply means for delivering an alternating current output to said intermediate electrode to create a signal for detection by said pair of electrodes across a length of said medium;
 (d) first and second operational amplifier means;
 (e) means coupling said pair of electrodes individually to the inputs of said first and second operational amplifier means, respectively;
 (f) comparator means coupled to said first and second operational amplifier means for detecting the difference in output signal levels from said first and second amplifier means;
 (g) asymmetrical impedance means coupled as feedback elements between the output terminals of said first and second operational amplifier means and the inputs thereof to which said pair of electrodes are coupled for establishing an initial imbalance across said operational amplifier outputs; and
 (h) means responsive to the magnitude of the difference in output levels of said outputs for initiating a medium rejuvenation cycle in said column.

* * * * *